United States Patent [19]
Kynett et al.

[11] Patent Number: 5,513,333
[45] Date of Patent: Apr. 30, 1996

[54] CIRCUITRY AND METHOD FOR PROGRAMMING AND ERASING A NON-VOLATILE SEMICONDUCTOR MEMORY

[75] Inventors: Virgil N. Kynett, El Dorado Hills; Mickey L. Fandrich, Placerville, both of Calif.

[73] Assignee: Intel Corporation, Santa Clara, Calif.

[21] Appl. No.: 100,508

[22] Filed: Sep. 15, 1993

Related U.S. Application Data

[62] Division of Ser. No. 654,375, Feb. 11, 1991, abandoned.

[51] Int. Cl.[6] ................................. G11C 16/06
[52] U.S. Cl. ............ 395/430; 365/189.07; 365/218
[58] Field of Search ................. 395/400, 425; 364/200 MS File, 900 MS File, DIG. 1, DIG. 2; 365/185, 195, 189.07, 218, 230.08, 233

[56] References Cited

U.S. PATENT DOCUMENTS

| | | | |
|---|---|---|---|
| 4,460,982 | 7/1984 | Gee et al. | 365/189 |
| 4,701,886 | 10/1987 | Sakakibara et al. | 365/189 |
| 4,811,294 | 3/1989 | Kobayashi et al. | 365/189 |
| 4,821,240 | 4/1989 | Nakamura et al. | 365/228 |
| 4,823,308 | 4/1989 | Knight | 380/4 |
| 5,014,191 | 5/1991 | Padgaonkar et al. | 395/425 |
| 5,034,922 | 7/1991 | Burgess | 365/189.07 |
| 5,053,990 | 10/1991 | Kreifels et al. | 394/425 |
| 5,073,873 | 12/1991 | Nogami | 365/189.05 |
| 5,126,975 | 6/1992 | Handy et al. | 365/230.01 |
| 5,222,046 | 6/1993 | Kreifels et al. | 365/230.06 |
| 5,224,070 | 6/1993 | Fandrich et al. | 365/185 |
| 5,243,575 | 9/1993 | Sambandan et al. | 365/233.5 |
| 5,307,470 | 4/1994 | Kataoka et al. | 395/430 |
| 5,333,300 | 7/1994 | Fandrich | 395/430 |

FOREIGN PATENT DOCUMENTS

| | | |
|---|---|---|
| 58-169395 | 10/1983 | Japan . |
| 62-52798 | 3/1987 | Japan . |
| 62-164299 | 7/1987 | Japan . |
| 62-205599 | 9/1987 | Japan . |
| 62-236199 | 10/1987 | Japan . |
| 62-298096 | 12/1987 | Japan . |

*Primary Examiner*—Jack A. Lane
*Attorney, Agent, or Firm*—Blakely, Sokoloff, Taylor & Zafman

[57] ABSTRACT

Circuitry for programming a non-volatile semiconductor memory is described. The circuitry includes a circuit for enabling the non-volatile semiconductor memory to program a bit of the non-volatile semiconductor memory. The enabling circuit causes the bit to be programmed according to a pattern bit. The circuitry also includes a second enabling circuit, which enables the non-volatile semiconductor memory to verify the programming of the bit. Circuitry for erasing a non-volatile semiconductor memory is disclosed. A method for programming a nonvolatile semiconductor memory is also described.

10 Claims, 14 Drawing Sheets

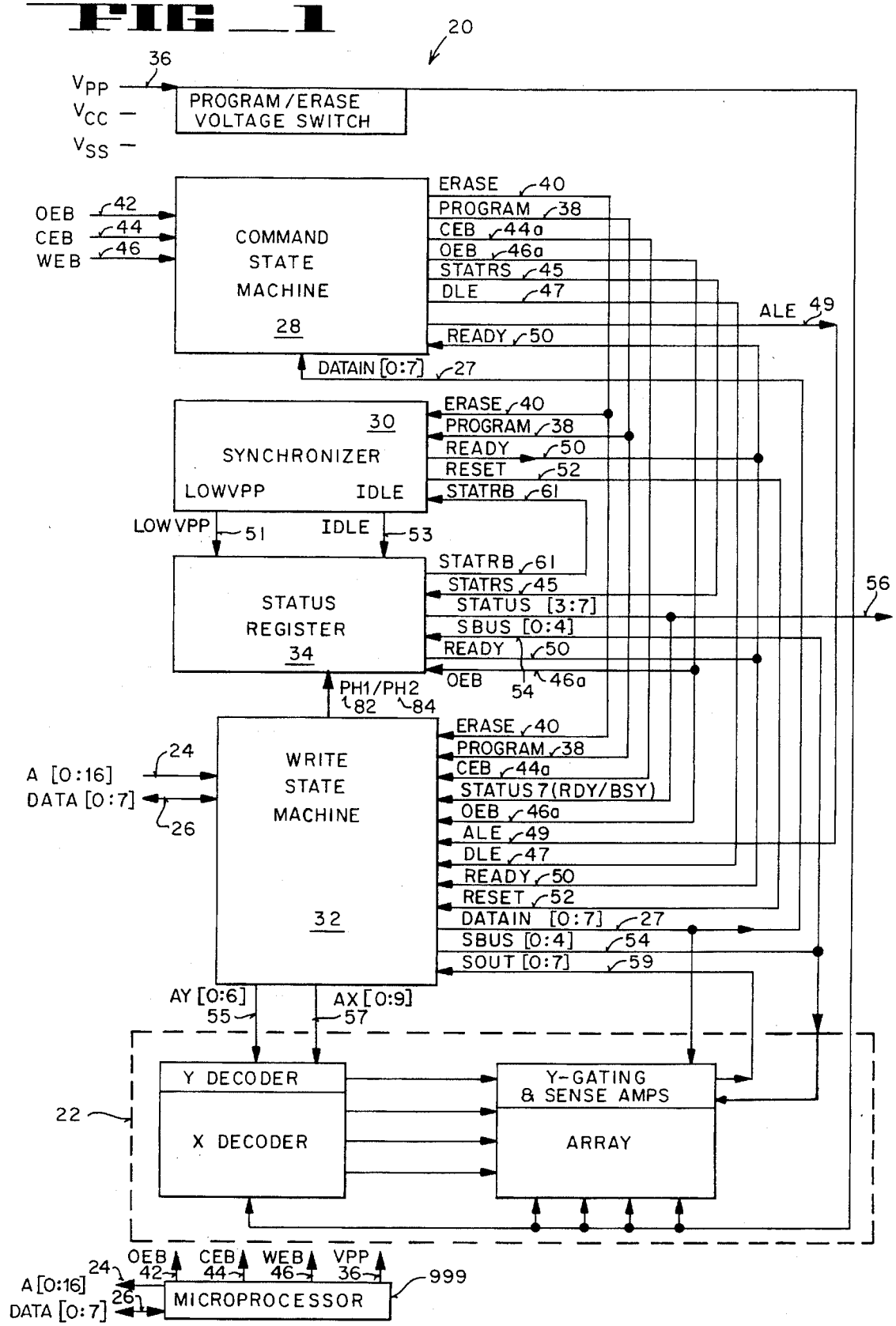

FIG_2

TABLE I

| COMMAND | BUS CYCLES REQ'D | FIRST BUS CYCLE | | | SECOND BUS CYCLE | | |
|---|---|---|---|---|---|---|---|
| | | OPERATION | ADDRESS | DATA | OPERATION | ADDRESS | DATA |
| READ ARRAY | 1 | WRITE | X | FFH | | | |
| READ STATUS REGISTER | 2 | WRITE | X | 70H | READ | X | SRD |
| CLEAR STATUS REGISTER | 1 | WRITE | X | 50H | | | |
| ERASE SETUP/ERASE CONFIRM | 2 | WRITE | X | 20H | WRITE | X | D0H |
| PROGRAM SETUP/PROGRAM | 2 | WRITE | X | 40H | WRITE | PA | PD |

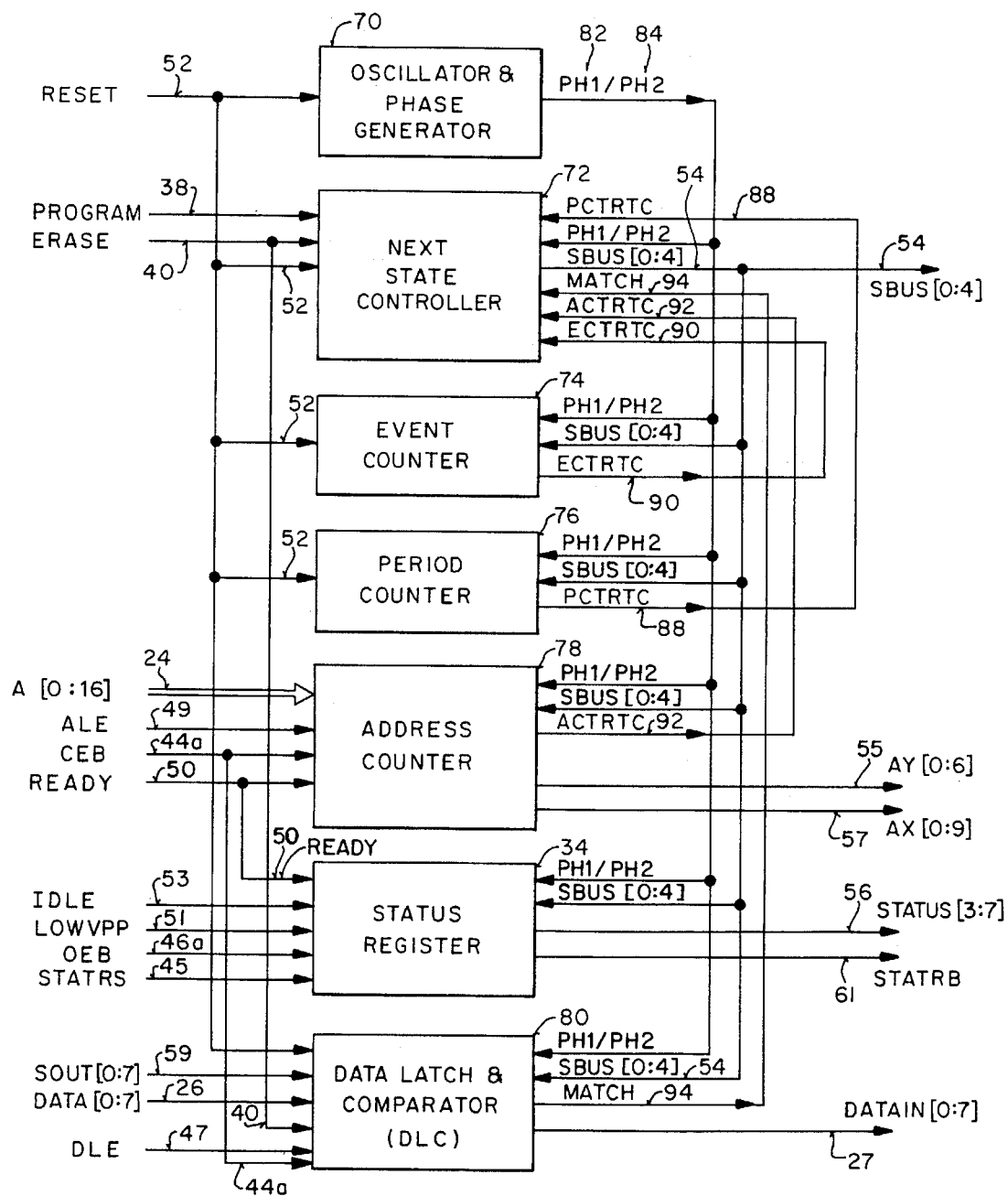
FIG_3  WRITE STATE MACHINE BLOCK DIAGRAM

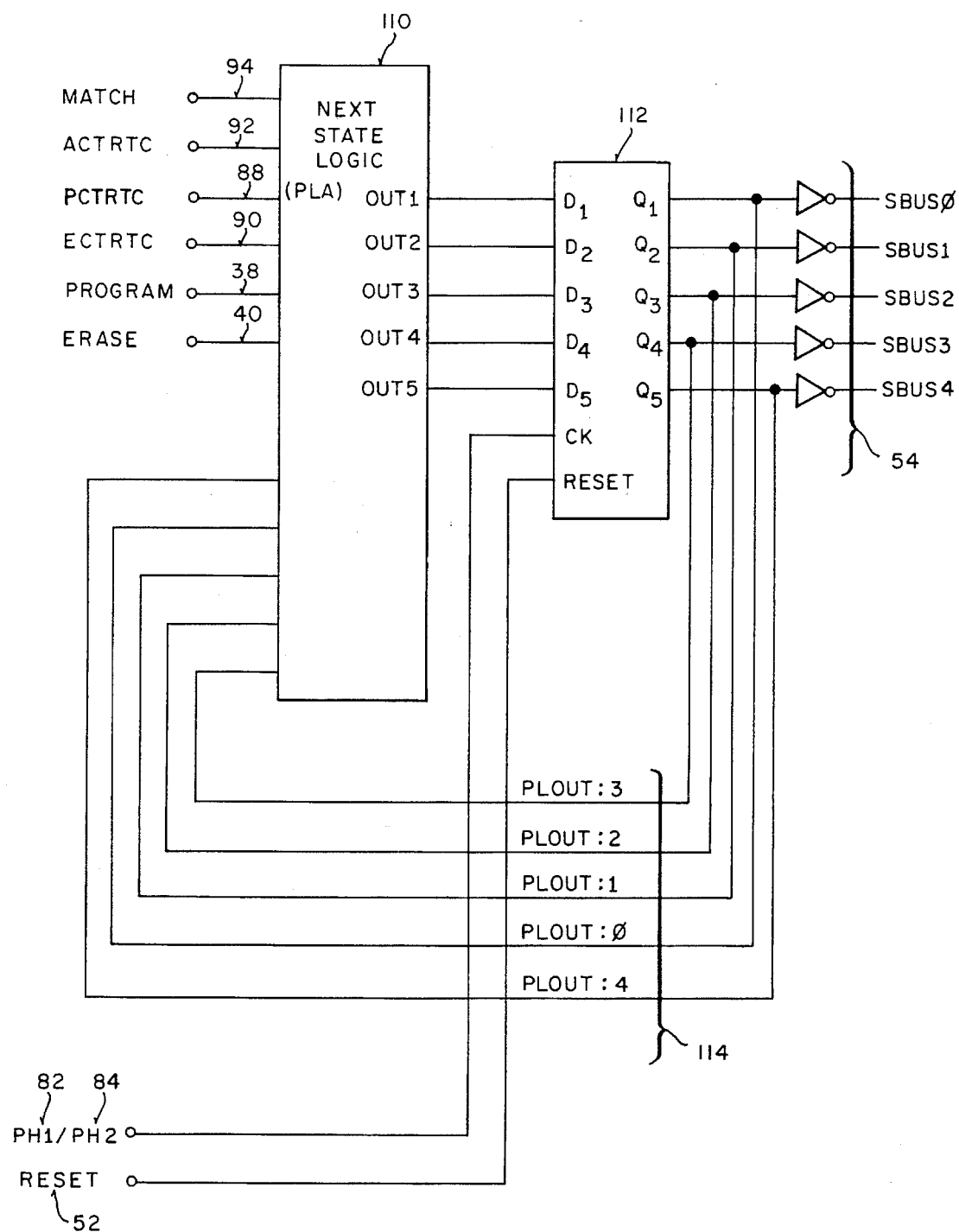

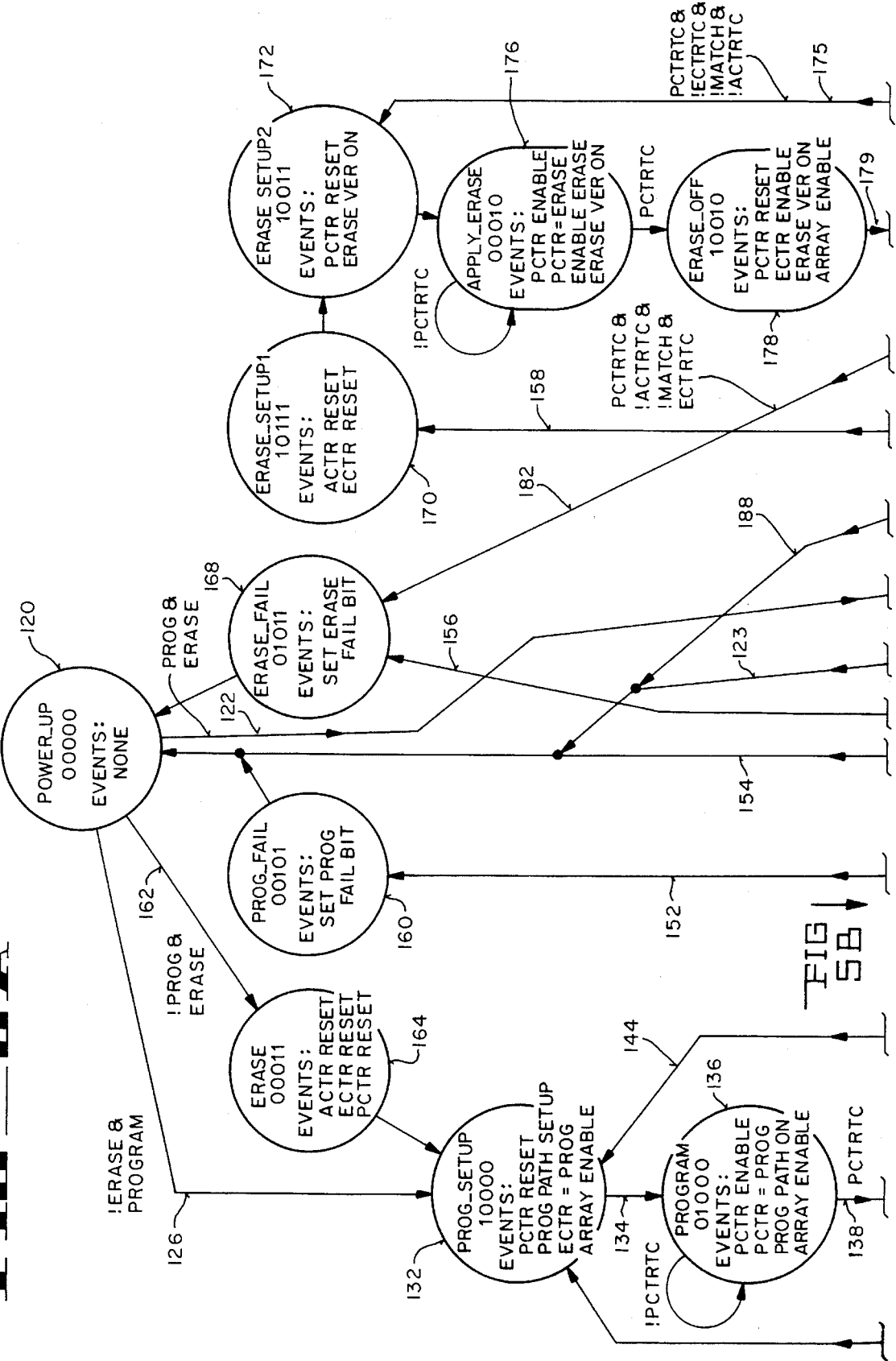
FIG_5A

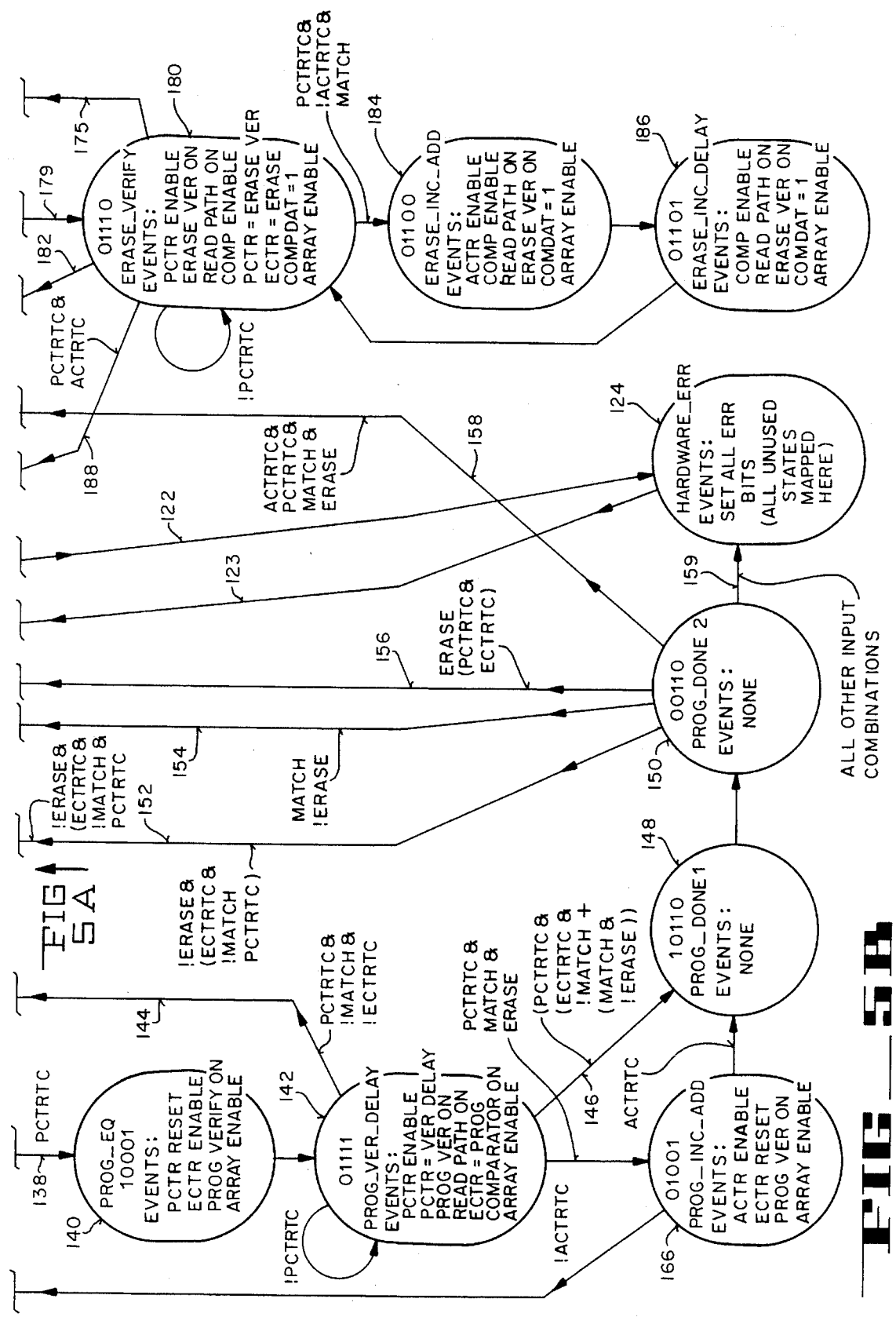
FIG_5B

FIG. 5

TABLE II

| SBUS [0:4] | ECTRST | ECTRN | ECTRR | ECTRPG | PCTRS | PCTRSERRSM | PCTRSLPG | PPCTRSLVR | DREE | CMPEN | CMPADT1 | READY | ERSFAIL | PGMFAIL | ACTRSN | PGSEUP | PGSM | ERASE | ERVER | PGVER | EA | STATE NAME |
|---|---|---|---|---|---|---|---|---|---|---|---|---|---|---|---|---|---|---|---|---|---|---|
| 00000 | - | - | 0 | 0 | 0 | 0 | 0 | 0 | 0 | - | - | 0 | 0 | 0 | 0 | 0 | 0 | 0 | 0 | 0 | 0 | POWER_UP |
| 00001 | 0 | 0 | 0 | 0 | 0 | - | 0 | - | 0 | - | - | 0 | 0 | 0 | 0 | 0 | - | 0 | - | 0 | - | APPLY_ERASE |
| 00010 | - | - | 0 | 0 | 0 | 0 | 0 | 0 | 0 | - | - | 0 | 0 | 0 | 0 | 0 | 0 | 0 | 0 | 0 | 0 | ERASE |
| 00011 | 0 | - | 0 | 0 | - | 0 | 0 | 0 | 0 | 0 | - | 0 | 0 | 0 | 0 | 0 | - | 0 | 0 | 0 | 0 | PROG_FAIL |
| 01000 | 0 | 0 | 0 | 0 | 0 | 0 | 0 | 0 | - | - | - | 0 | - | - | 0 | - | 0 | 0 | 0 | 0 | - | PROGRAM |
| 01001 | 0 | 0 | 0 | 0 | 0 | 0 | 0 | 0 | - | - | - | 0 | - | - | 0 | 0 | 0 | 0 | 0 | 0 | 0 | PROG_INC_ADD |
| 01010 | 0 | 0 | 0 | 0 | 0 | 0 | 0 | 0 | - | - | - | 0 | - | - | 0 | 0 | 0 | 0 | 0 | 0 | - | ERASE_FAIL |
| 01011 | 0 | 0 | 0 | 0 | - | 0 | 0 | 0 | - | - | - | 0 | 0 | 0 | 0 | 0 | 0 | 0 | - | 0 | - | ERASE_INC_ADD |
| 01100 | 0 | 0 | 0 | 0 | 0 | 0 | 0 | 0 | - | - | - | 0 | - | - | 0 | 0 | 0 | 0 | - | 0 | - | ERASE_INC_DELAY |
| 01101 | 0 | 0 | 0 | 0 | 0 | 0 | 0 | 0 | 0 | - | - | 0 | 0 | 0 | 0 | 0 | 0 | - | 0 | 0 | - | ERASE_VERIFY |
| 01110 | 0 | 0 | 0 | 0 | 0 | 0 | 0 | 0 | 0 | 0 | - | 0 | 0 | 0 | 0 | 0 | 0 | 0 | 0 | - | - | PROG_VER_DELAY |
| 01111 | 0 | 0 | 0 | 0 | 0 | 0 | 0 | 0 | 0 | 0 | 0 | 0 | 0 | 0 | 0 | 0 | 0 | 0 | 0 | 0 | - | PROG_SETUP |
| 10000 | 0 | 0 | 0 | 0 | 0 | 0 | 0 | 0 | 0 | 0 | 0 | 0 | 0 | 0 | 0 | 0 | 0 | 0 | 0 | 0 | 0 | PROG_EQ |
| 10001 | 0 | 0 | 0 | 0 | 0 | 0 | 0 | 0 | 0 | 0 | 0 | 0 | 0 | 0 | 0 | 0 | 0 | 0 | 0 | 0 | 0 | ERASE_OFF |
| 10010 | 0 | 0 | 0 | 0 | 0 | 0 | 0 | 0 | 0 | 0 | 0 | 0 | 0 | 0 | 0 | 0 | 0 | 0 | 0 | 0 | 0 | ERASE_SETUP2 |
| 10011 | 0 | 0 | 0 | 0 | 0 | 0 | 0 | 0 | 0 | 0 | 0 | 0 | 0 | 0 | 0 | 0 | 0 | 0 | 0 | 0 | 0 | PROGRAM_DONE1 |
| 10110 | - | - | - | - | - | - | - | - | - | - | - | - | - | - | - | - | - | - | - | - | - | PROGRAM_DONE2 |
| 10111 | - | - | - | - | - | - | - | - | - | - | - | - | - | - | - | - | - | - | - | - | - | ERASE_SETUP1 |
| 11000 | - | - | - | - | - | - | - | - | - | - | - | - | - | - | - | - | - | - | - | - | - | HARDWARE_ERRS |
| 11001 | - | - | - | - | - | - | - | - | - | - | - | - | - | - | - | - | - | - | - | - | - | |
| 11010 | - | - | - | - | - | - | - | - | - | - | - | - | - | - | - | - | - | - | - | - | - | |
| 11011 | - | - | - | - | - | - | - | - | - | - | - | - | - | - | - | - | - | - | - | - | - | |
| 11100 | - | - | - | - | - | - | - | - | - | - | - | - | - | - | - | - | - | - | - | - | - | |
| 11101 | - | - | - | - | - | - | - | - | - | - | - | - | - | - | - | - | - | - | - | - | - | |
| 11110 | - | - | - | - | - | - | - | - | - | - | - | - | - | - | - | - | - | - | - | - | - | |
| 11111 | - | - | - | - | - | - | - | - | - | - | - | - | - | - | - | - | - | - | - | - | - | |

FIG_7

TABLE III

| SIGNAL ACRONYM | SIGNAL NAME |
|---|---|
| ECTRST | – EVENT COUNTER RESET |
| ECTREN | – EVENT COUNTER ENABLE |
| ECTRER | – EVENT COUNTER TC OUT = ERASE NOMINAL (2000) |
| ECTRPG | – EVENT COUNTER TC OUT = PROGRAM NOMINAL (50) |
| PCTRST | – PERIOD COUNTER RESET (PCTR RUNS IN ALL STATES RESET IS NOT ASSERTED |
| PCTSELERS | – PERIOD COUNTER TC OUT = ERASE PULSE WIDTH |
| PCTSELPGM | – PERIOD COUNTER TC OUT = PROGRAM PULSE WIDTH |
| PCTSELVER | – PERIOD COUNTER OUT = VERIFY DELAY |
| DE | – ENABLE READPATH (SENSE AMPS/DRAIN BIAS, ETC.) OF MEMORY ARRAY |
| CMPEN | – COMPARATORS ENABLED |
| COMPDAT1 | – FORCE COMPARATOR DATA TO 1 IF ERASE OPERATION IN PROGRESS |
| READY | – SET RDY/BSY# =1 |
| ERSFAIL | – SET ERASE FAIL BIT |
| PRGMFAIL | – SET PROGRAM FAIL BIT |
| ACTRST | – ADDRESS COUNTER RESET |
| ACTEN | – ADDRESS COUNTER ENABLED FOR COUNTING |
| PGSETUP | – PROGRAM SETUP |
| PGM | – PROGRAM DATA IN |
| ERASE | – APPLY ERASE VOLTAGES |
| ERVER | – ENABLE ERASE VERIFICATION OF MEMORY ARRAY |
| PGVER | – ENABLE PROGRAM VERIFICATION OF MEMORY ARRAY |
| AE | – ENABLE THE MEMORY ARRAY (X DECODERS, ETC.) |

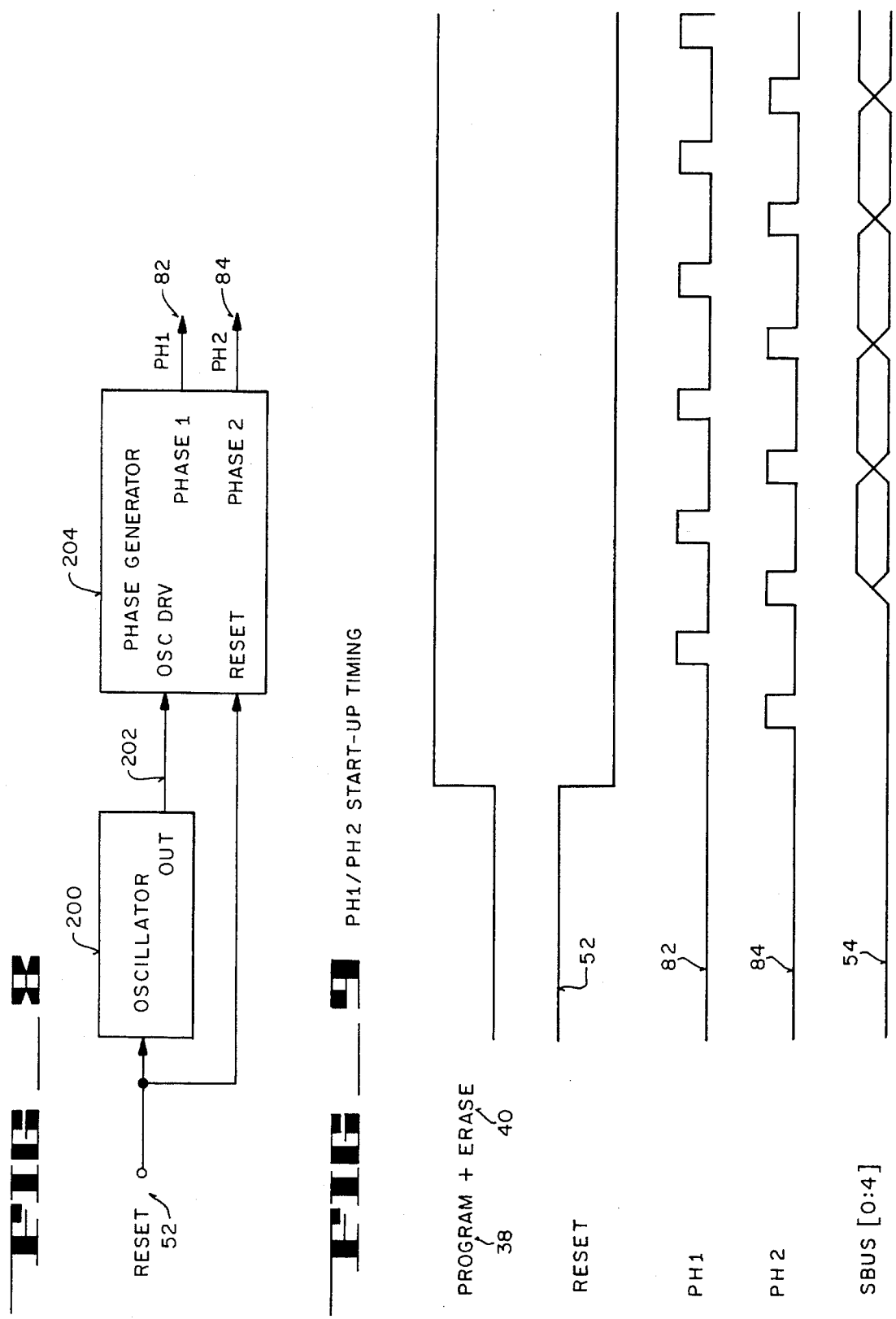

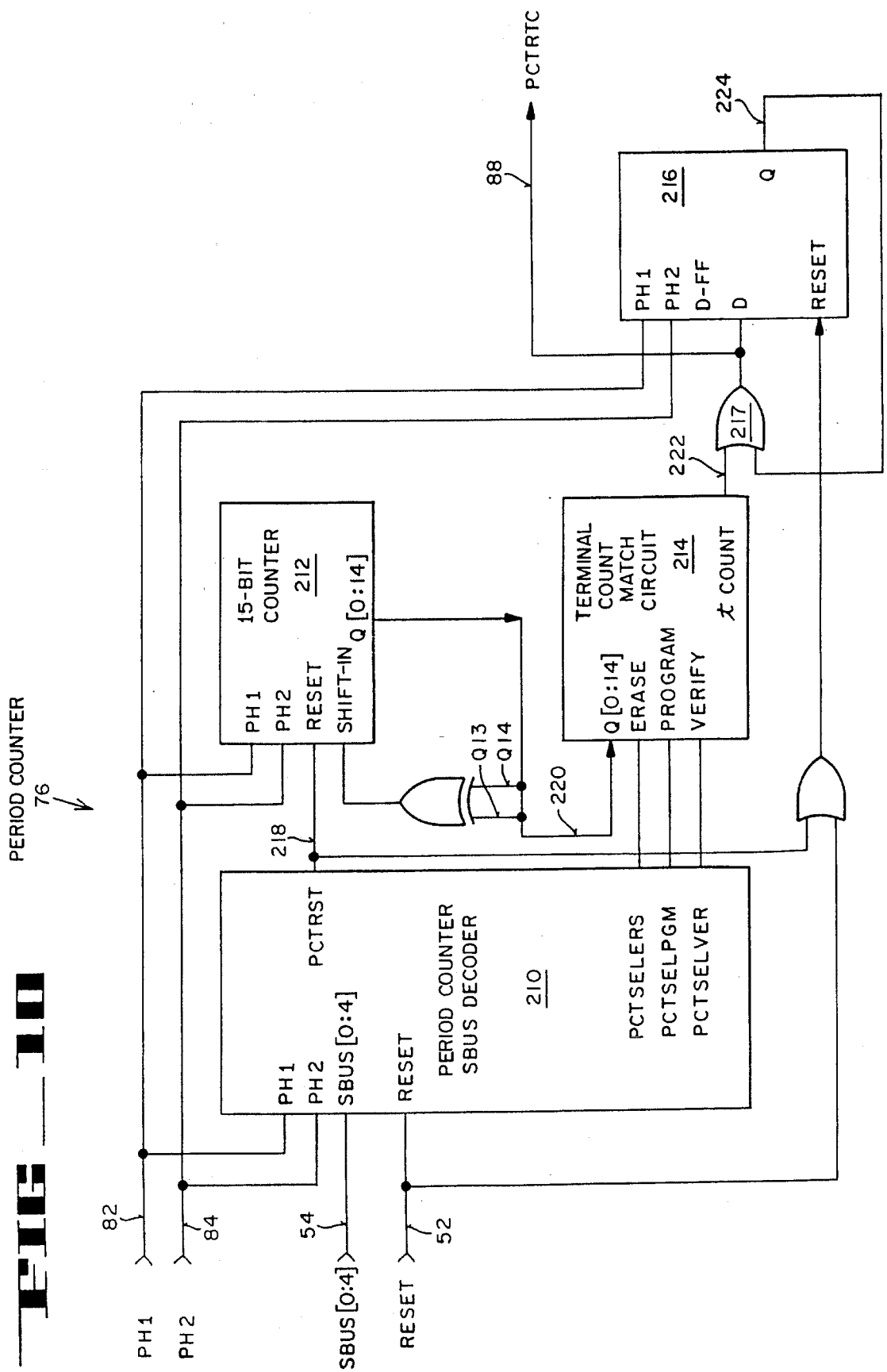
FIG_10

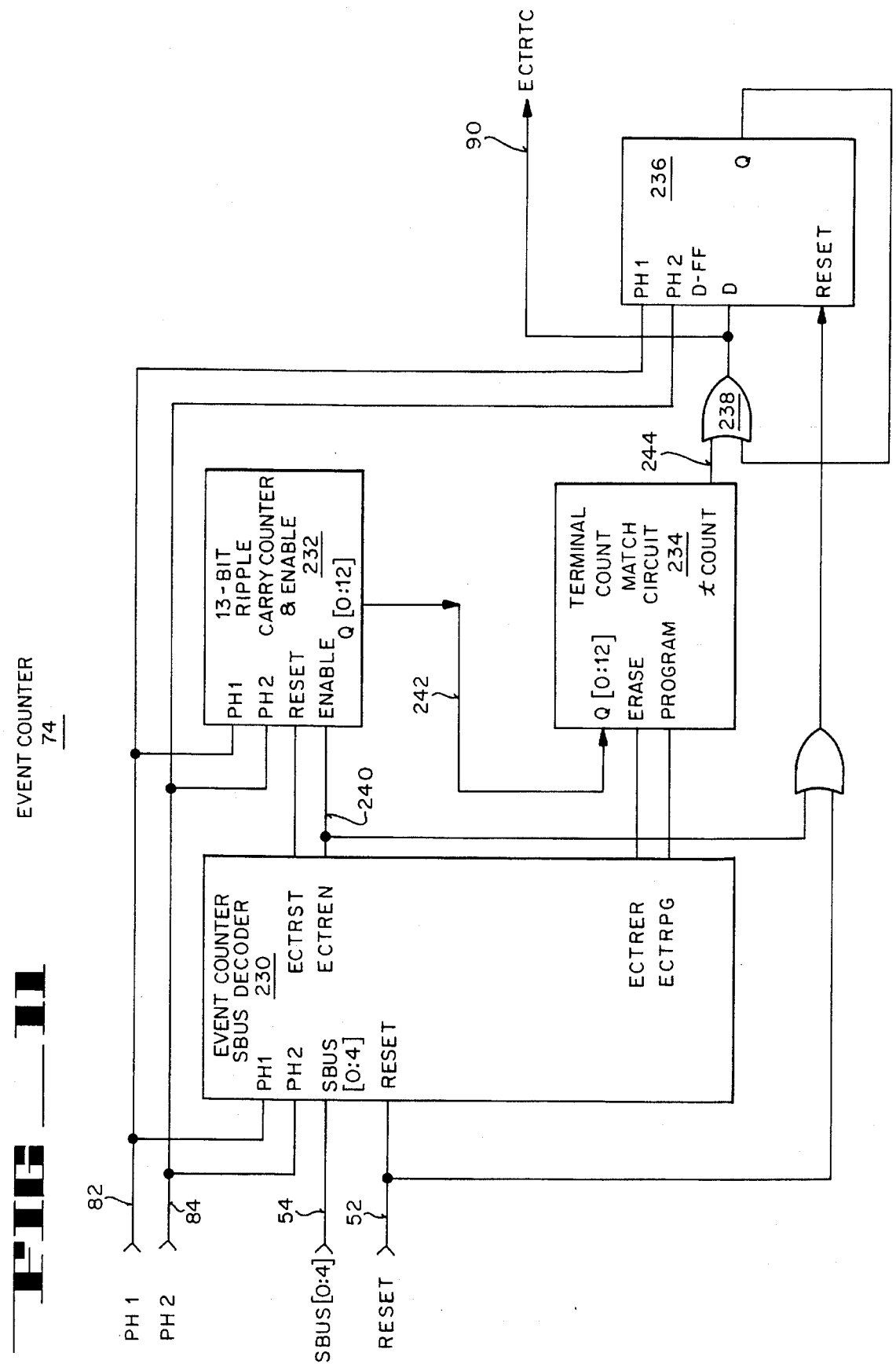
FIG_11

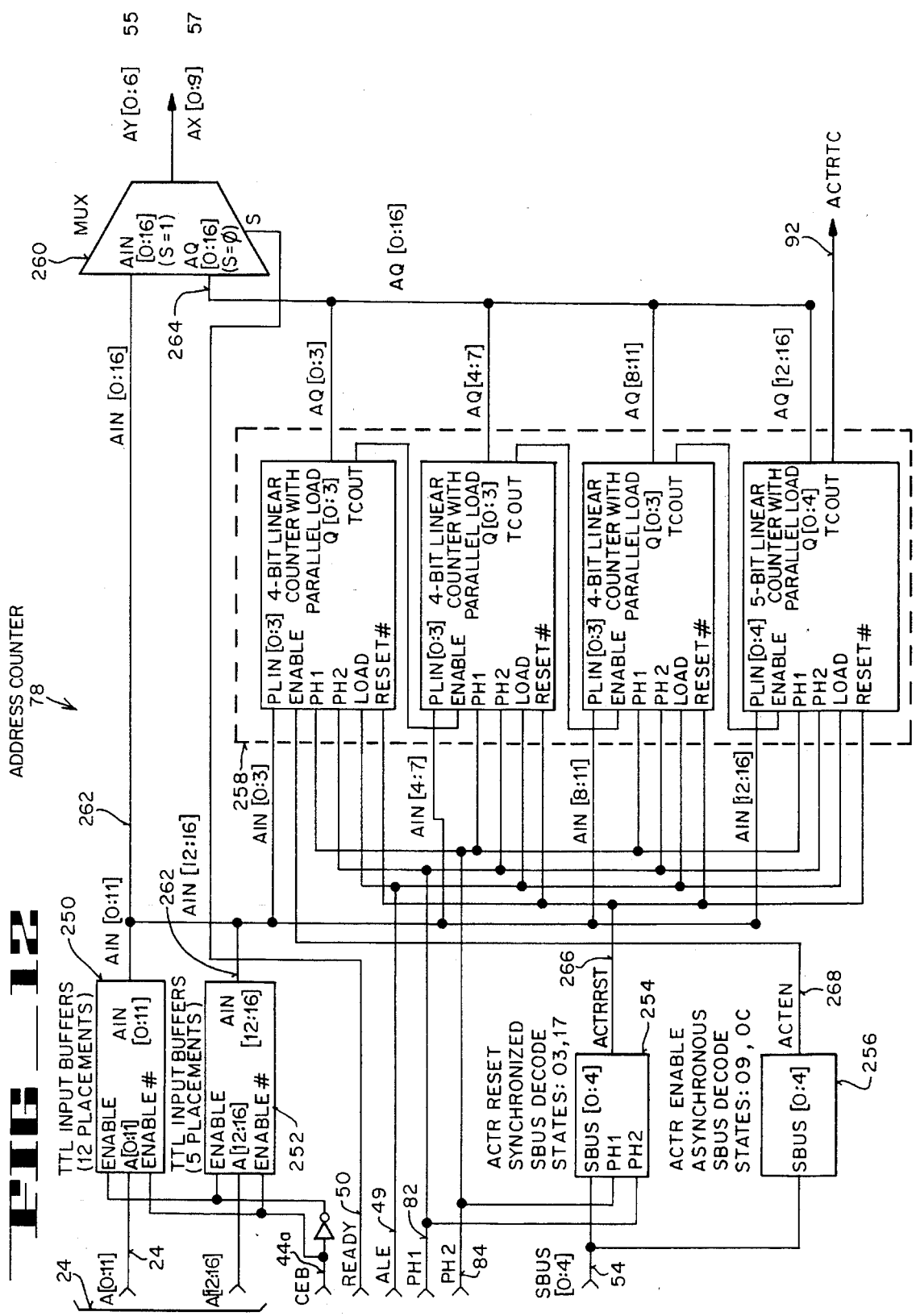

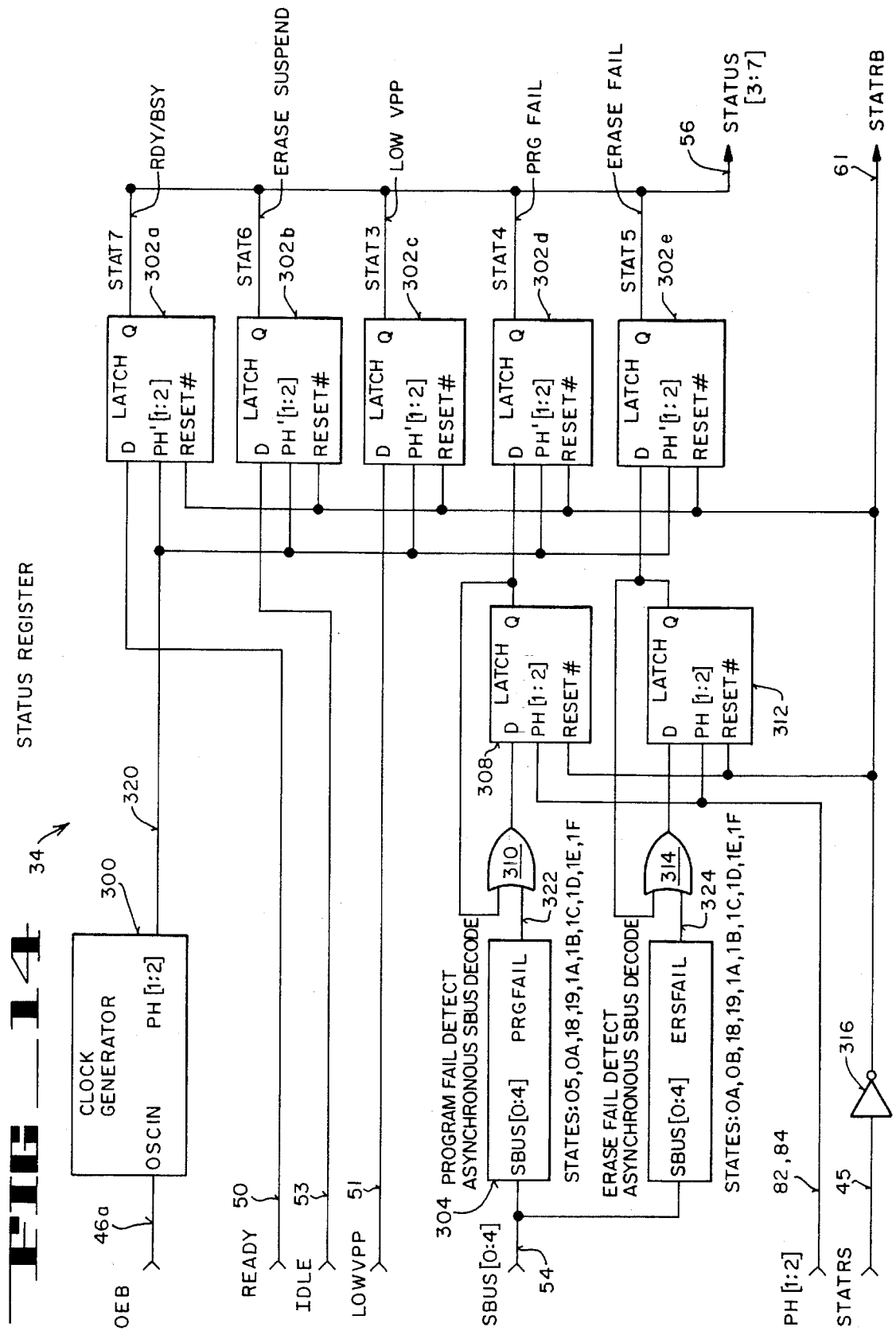

CIRCUITRY AND METHOD FOR PROGRAMMING AND ERASING A NON-VOLATILE SEMICONDUCTOR MEMORY

This is a divisional of application Ser. No. 07/654,375, filed Feb. 11, 1991, now abandoned.

FIELD OF THE INVENTION

The present invention pertains to the field of non-volatile semiconductor memories. More particularly, the present invention relates to circuitry and a method for erasing and programming non-volatile semiconductor memories.

BACKGROUND OF THE INVENTION.

One type of prior non-volatile semiconductor memory is the flash electrically erasable programmable read-only memory ("flash EEPROM"). The flash EEPROM can be programmed by a user, and once programmed, the flash EEPROM retains its data until erased. After erasure, the flash EEPROM may be programmed with new code or data.

Flash memories differ from conventional electrically erasable programmable read only memory ("EEPROMs") with respect to erasure. Conventional EEPROMs typically use a select transistor for individual byte erase control. Flash memories, on the other hand, typically achieve much higher density with single transistor cells. During one prior art flash memory erase method, a high voltage is supplied to the sources of every memory cell in a memory array simultaneously. This results in a full array erasure.

For one prior flash EEPROM, a logical "one" means that few if any electrons are stored on a floating gate associated with a bit cell. A logical "zero" means that many electrons are stored on the floating gate associated with the bit cell. Erasure of this type of flash memory causes a logical one to be stored in each bit cell. Each single bit cell of this type of flash memory cannot be overwritten from a logical zero to a logical one without a prior erasure. Each single bit cell of that flash memory can, however, be overwritten from a logical one to a logical zero, given that this entails simply adding electrons to a floating gate that contains the intrinsic number of electrons associated with the erased state.

One prior flash EEPROM is the 28F256 complementary metal oxide semiconductor ("CMOS") flash memory sold by Intel Corporation of Santa Clara, Calif., which is a 256 kilobit flash EEPROM. The 28F256 flash memory includes a command register to manage electrical erasure and reprogramming. Commands are written to the command register from a controlling microprocessor using standard microprocessor write timings. The command register contents serve as input to an internal state machine that controls erase and programming circuitry.

That controlling microprocessor controls the erasure and programming of the flash memory. A prior Quick-Erase™ algorithm of Intel Corporation can be used by the microprocessor to erase the flash memory. The prior Quick-Erase™ algorithm requires that all bits first be programmed to their charged state, which is data equal to 00 (hexidecimal). Erasure then proceeds by pulling the source of the transistors in the array up to a high voltage level for a period of 10 msec, while keeping the transistor gates at zero volts. After each erase operation, byte verification is performed. The prior Quick-Erase™ algorithm allows up to 3000 erase operations per byte to recognize erasure failure. Proper device operation requires that the erasure procedure be strictly followed.

The prior Quick-Pulse Programming™ algorithm of Intel Corporation can be used by the microprocessor to then program the flash memory. The Quick-Pulse Programming™ algorithm requires that a programming pulse of a specific duration and voltage level be applied to the program power supply Vpp and the device power supply Vcc. For example, for certain prior Intel flash memories a programming pulse of 10 μsec has been suggested while Vpp is held at 12.75. After the programming pulse is applied, the user must verify whether the memory cell addressed is properly programmed. If not properly programmed, a programming pulse may be reapplied a number of times before a programming error is recognized, Intel's Quick-Pulse Programming™ algorithm allows up to 25 programming operations per byte, Proper and reliable operation of the flash memory mandates that the programming procedure be strictly followed.

One disadvantage of the prior way of using a microprocessor to control erasure and programming of the flash memory is that it ties up the microprocessor, thus requiring a relatively high level of microprocessor overhead. This, in turn, decreases system throughput.

Another disadvantage of the prior way of using a controlling microprocessor to control the erasure and programming of the flash memory is the relatively high complexity of typical erasure/programming software. This complex software requires a relatively high level of user sophistication. Moreover, this complex software increases the likelihood of a customer error, such as over-erasure of the flash memory.

SUMMARY AND OBJECTS OF THE INVENTION

One of the objects of the present invention is to provide circuitry and a method for programming and erasing a non-volatile semiconductor memory, Another of the objects of the present invention is to minimize the amount of microprocessor code needed to erase and program a non-volatile semiconductor memory.

Another of the objects of the invention is to allow a microprocessor to respond to system requests while a non-volatile semiconductor memory is being automatically erased and programmed.

A write state machine for programming and erasing a non-volatile flash memory array in response to a single command is described. The write state machine includes a controller, a comparator circuit, an event counter and a period counter. The controller controls the other circuitry during program and erase operations according to the command received and the status of the other circuits. The period counter determines the duration of programming, erase and verify pulses applied to the memory array. The event counter determines the total number of pulses applied to the memory array during the execution of program and erase commands. The comparator circuit compares data stored within the memory array to the data it should store as a result of the program operation or erase operation.

Other objects, features, and advantages of the present invention will be apparent from the accompanying drawings and from the detailed description that follows below.

BRIEF DESCRIPTION OF DRAWING

The present invention is illustrated by way of example and not by way of limitation in the figures of the accompanying drawings in which like references indicate like elements and in which;

FIG. 1 is a block diagram of circuitry of a flash memory, including a write state machine;

FIG. 2 illustrates Table I, which lists flash memory commands;

FIG. 3 is a block diagram of the write state machine;

FIG. 4 is a block diagram of the circuitry of next state controller;

FIGS. 5a and 5b are a state diagram of the method of programming and erasing flash memories;

FIG. 6 illustrates Table II which lists SBUS values for each write state machine state;

FIG. 7 is illustrates Table III, which describes signal names;

FIG. 8 is a block diagram of the oscillator and phase generator;

FIG. 9 is a start-up timing diagram for PH1 and PH2;

FIG. 10 is a block diagram of the period counter;

FIG. 11 is a block diagram of the event counter;

FIG. 12 is a block diagram of the address counter;

FIG. 13 is a block diagram of the data latch and comparator;

FIG. 14 is a block diagram of the status register.

DETAILED DESCRIPTION

Figure 15:
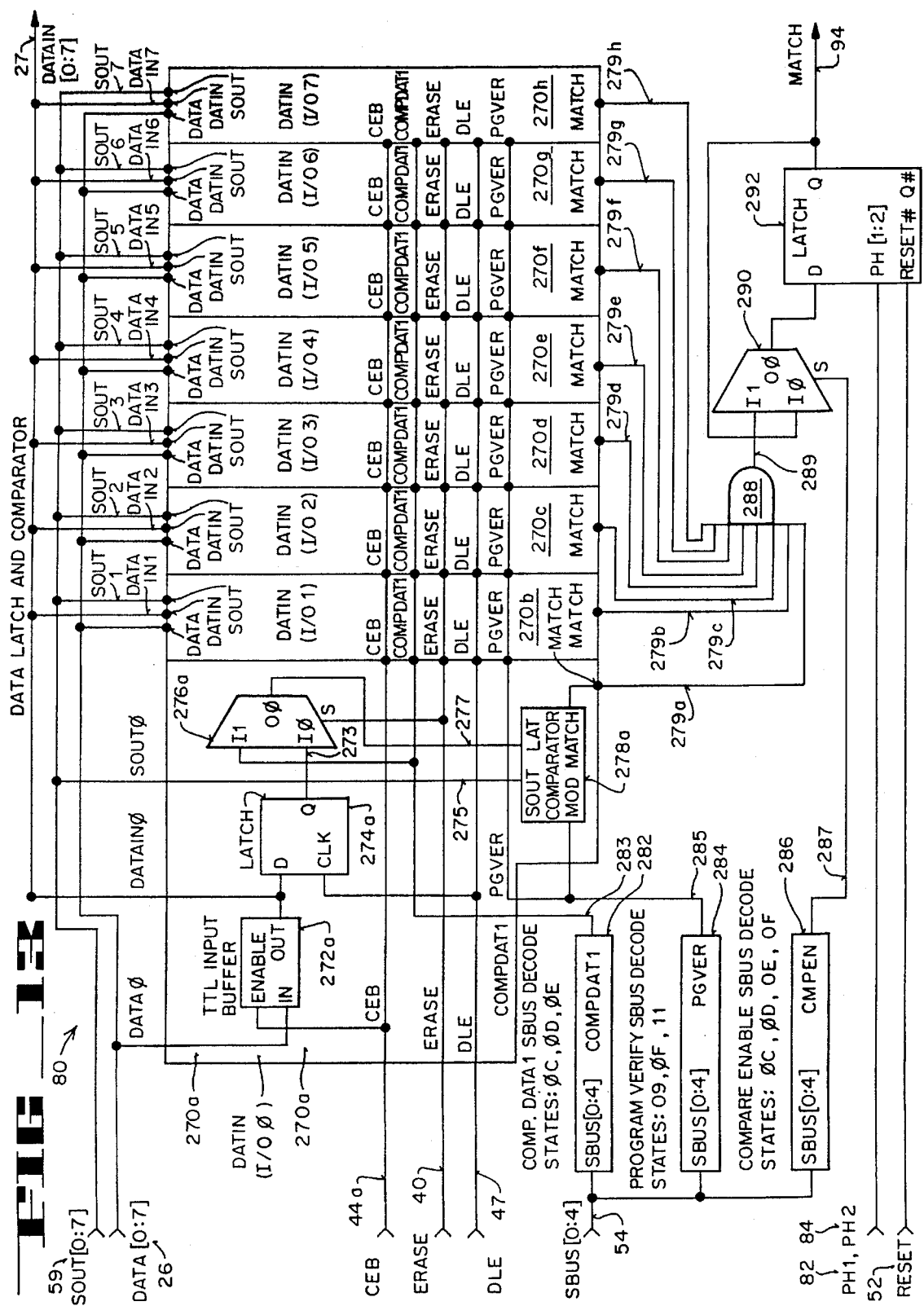

FIG. 1 illustrates in block diagram form the circuitry of flash EPROM 20, which is a preferred embodiment of the present invention. Flash EPROM 20 is also referred to as flash memory 20.

As described in more detail below, flash EPROM 20 includes write state circuitry 32. Write state circuitry 32 sequences the non-volatile semiconductor memory 20 through multi-step sequences to program or erase memory contents as desired with only an initiating command from microprocessor 999. Once a program or erase sequence is initiated, write state machine 32 controls programming and erasure. Status register 34 indicates to the microprocessor 999 when program and erase operations have been completed.

Vpp 36 is the erase/program power supply voltage for the flash memory. Vcc is the device power supply for flash memory 20 and Vss is ground. In one embodiment, Vpp 36 is 12.0 volts and Vcc is approximately 5 volts.

In the absence of high voltage on Vpp 36, flash memory 20 acts as a read-only memory. The data stored at an address supplied via lines 24 is read from memory array 22 and made available via data input/output lines 26 to the circuitry external to the flash memory 20.

Flash memory 20 has three control signals: chip-enable bar CEB 44, WEB 46, and output-enable bar OEB 42. The chip-enable bar CEB 44 input is the power control and is used to select flash memory 20. CEB 44 is active low. The output-enable bar input OEB 42 is the output control for flash memory 20 and is used to gate data from the output pins from flash memory 20. OEB 42 is active low. Both control signals CEB 44 and OEB 42 must be logically active to obtain data at the data lines 26 of flash memory 20.

The write enable bar signal, WEB 46, allows writes to command state machine 28 while CEB 44 is low. Write enable bar signal 46 is active low, Addresses and data are latched on the rising edge of WEB 46. Standard microprocessor timings are used.

Device operations are selected by writing specific data patterns into the flash memory via data input/output lines 26. FIG. 2 defines certain commands.

SRD in FIG. 2 represents data read from the status register 34. PA in FIG. 2 represents the address of the memory location to be programmed and PD represents the data to be programmed at address PA.

Erase operations are performed on memory array 22 in response to a two-cycle erase command sequence, An erase-setup command is first written, followed by the erase-confirm command. Array preconditioning, erase and erase verification are all handled internally by the write state machine, invisible to the microprocessor 999 in response to the erase command. The erase operation takes approximately 1 second.

This two step erase, set-up followed by execution, ensures that memory contents are not accidentally erased. Erasure can occur only when high voltage is applied to Vpp. In the absence of this high voltage, the memory contents are protected against erasure.

The erase event involves two major tasks: preconditioning and erasing. Preconditioning memory array 22 by bringing cell voltages to approximately 6.75 volts protects the longevity of memory array 22 by preventing cell voltages during erasure from dropping to levels that could result in cell leakage. Array erasure brings cell voltages to approximately 3.25 volts, a logic 1.

The microprocessor 999 can detect the completion of an erase operation by issuing a Read Status Register command and analyzing the status data. When the status register 34 indicates that the erase operation is complete, the erase failure status bit should be checked. After examination the status register 34 error bits should be cleared as appropriate. Other operations can be executed only after receipt of the appropriate command.

Programming is also executed by a two-cycle command sequence. The Program Set-up command is written to the command state machine 28 via data lines 26, followed by a second write command specifying the address and data to be programmed. The write state machine 32 then takes over, controlling the program and verify algorithms internally. Polling the status register 34 with the Status Register Read command allows microprocessor 999 to determine when the programming operation is complete. Only the Read Status Register command is valid while programming operation is ongoing.

When the status register 34 indicates that a programming operation is complete, the program fail bit should be checked. After examination, the microprocessor 999 should clear the status register error bits as appropriate.

In a preferred embodiment, the circuitry of flash memory 20 shown in FIG. 1 is on a single substrate. In a preferred embodiment, flash memory 20 employs CMOS circuitry.

Flash memory 20 includes a memory array 22, which includes memory cells that store data at addresses. The memory array 22 includes a read path, a write path and verification circuitry, which are not illustrated. In addition, flash memory 20 includes on-chip command state machine ("CSM") 28, synchronizer 30, write state machine ("WSM") 32 and status register 34.

Commands to program or erase memory array 22 are applied via data lines 26. The data on data lines 26 is passed on to command state machine 28. The command state machine 28 decodes the data and if it represents an erase, program or status register reset command, the CSM 28 begins generating the appropriate control signals. The control signals provided by the command state machine 28 to the write state machine 32 include PROGRAM 38, ERASE 40, status register reset signal STATRS 45, address latch enable ALE 49, and data latch enable signal DLE 47.

The program and erase algorithms are regulated by the write state machine 32, including program pulse repetition where required and internal verification of data, as will be discussed in detail herein below.

Write state machine 32 latches in the necessary address and data needed to perform erase and program operations from inputs A [0:16]24 and D [0:7]26. The operation of the write state machine's address and data latches is controlled respectively by address latch enable signal ALE 49 and data latch enable signal DLE 47 from the CSM 28.

The write state machine 32 interfaces with memory array 22 via array address signals AY [0:6]55 and AX [0:9]57 and sense amp outputs SOUT [0:7]59, which represent the data stored at the addressed memory location. When it is active, the write state machine controls the read path, the write path, and the verification circuitry of the memory array 22 via SBUS [0:4]54.

Write state machine 32 also reports its status during operation to synchronizer 30 and status register 34 via SBUS [0:4]54.

The synchronizer 30 provides synchronization between the write state machine 32 and the command state machine 28. Upon receipt of either an active ERASE 38 or PROGRAM 40 signal, synchronizer 30 forces the READY signal 50 to a logic low, indicating to the command state machine 28 and the status register 34 that the write state machine 32 is busy. When the write state machine 32 completes its operation, synchronizer 30 shuts down the write state machine 32 by setting READY.

The synchronizer 30 resets the write state machine 32 whenever ERASE 38 and PROGRAM 40 go to a logic low by forcing RESET signal 52 to a logic high.

The synchronizer 30 also reports to the status register, providing information about the status of write state machine 32 operation via LOWVPP 51.

The status register 34 decodes SBUS [0:4]54 and indicates to the microprocessor 999 whether an operation is complete or not and its success via STATUS outputs 56. STATUS outputs 56 are multiplexed onto the data lines 26.

FIG. 3 illustrates in block diagram form the circuitry of write state machine 32 and its connection to the status register 34. The write state machine 32 includes an oscillator and generator 70, a next state controller 72, an event counter 74, a period counter 76, an address counter 78 and a data latch and comparator ("DLC") 80.

RESET 52 is applied to nearly all circuits within the write state machine 32. RESET 52 forces critical nodes within the write state machine 32 to known states. For example, RESET 52 forces to a logic zero the terminal count signals 88, 90 and 92.

Shortly after receiving an inactive RESET signal 52, the oscillator/phase generator 70 begins generating two non-overlapping phase clocks, phase 1, PH1 82, and phase 2, which are routed to nearly all of the WSM 32 circuitry. PH2 84 is the first clock active after RESET 52.

Next state controller 72 controls and coordinates the activities of the write state machine 32 and determines the WSM's next state. Next state controller 72 generates the five outputs SBUS [0:4]54, which indicate the WSM's current state.

Each circuit receiving SBUS [0:4]54 from the next state controller 72 performs its own SBUS [0:4]54 decode to determine its next task. This design allows many tasks to be performed in parallel, minimizing the time needed it takes to perform erase and program functions.

The period counter 76 determines and times the pulse periods for array voltages during program and erase operations. Another period indicated by period counter 76 is the delay between programming or erasing and verification of valid data from memory cells. By going active-high, the period counters 76 terminal count signal, PCTRTC 88, informs the next state controller 72 that the selected period of time has elapsed.

The period counter 76 decodes SBUS [0:4]54 to select the desired pulse period. SBUS [0:4]54 also causes the period counter 76 to reset its count one state before period counter 76 is to be enabled.

The event counter 74 determines when the maximum number of program or erase operations per byte has been reached. When the maximum number of operations per byte has been reached, the event counters 74 informs the next state controller 72 by bringing the event terminal count signal, ECTRTC 90, to a logic high. The event counter 74 determines the maximum number of operations by decoding the SBUS [0:4] 54. In the preferred embodiment, the maximum number of program pulses per program operation is set to 50 and the maximum number of erase pulses per erase operation is set to 8192.

Within WSM 32, the address counter 78 functions as both an input buffer and a counter. When READY 50 is high the address at address lines A [0:16] is output as signals AY [0:6]55 and AX [0:9]57. Signals AY [0:6]55 and AX [0:9]57 point to the location of the byte in memory array 22 which is to be programmed, erased or read.

After the address has been input to the input buffers, the address from the input buffers will be loaded into the address counter 78 under the control of CSM 28 via the signal ALE 49. The address counter 78 then counts through all the addresses in the memory array 20. The address counter 78 indicates to the next state controller 72 that the end of memory has been reached by forcing its terminal count signal ACTRTC 92, to a logic one.

The data latch and comparator (DLC) 80 is the interface between the WSM 32 and the command state machine 28, and memory array 22 and data lines 26. TTL data input on data lines 26 is buffered by the DLC 80 and passed on to the command state machine 28 as DATAIN [0:7] signals 27.

If DATAIN [0:7] signals 27 represent a program command, the command state machine 28 will direct DLC 80 to store the information at data lines 26 by setting the data latch enable signal DLE 47 to a logic one. During a program operation, the DLC 80 compares the data stored in its latches to sense amp signals SOUT [0:7]59 and indicates a match by setting MATCH 94 to a logic high.

The DLC 80 compares the sense amp signals, SOUT [0:7]59, which are indicative of memory cell contents, to a reference logic level during erase verification and indicates successful erasure to next state controller 72 by setting MATCH 94 to a logic high.

The status register 34 reports the status of the write state machine 32 to the microprocessor 999 via status signals STATUS [3:7]56, which are multiplexed onto data lines 26. The status register 34 determines the write state machine's status based upon the signals READY 50, LOWVPP51, and SBUS [0:4]54.

FIG. 4 illustrates in block diagram form the circuitry of next state controller 72. Next state controller 72 includes next state logic 110 and a master slave D-latch 112, in the preferred embodiment, the next state logic 110 is implemented as a programmable logic array.

Next state logic 110 determines the next state of each circuit within the write state machine 32 based upon the write state machine's previous state, as represented by signals PLOUT [0:4]114, the terminal count signals, PCTRC 88, ECTRTC 90 and ACTRC 92, MATCH 94, PROGRAM 38 and ERASE 40. Each circuit providing an input to the next state logic 110 does so by the next active PH2 84 following a transition in state by SBUS [0:4]54. They are able to do so because all circuits within the write state machine 32 are master/slave devices whose outputs are valid on PH2 84.

The output of next state logic 110 is latched into latch 112 and provided to the rest of the write state machine circuitry as SBUS [0:4]54.

Status bus outputs SBUS [0:4]54 become active on the second PH2 84 rising edge after RESET 52 is cleared. As a result of SBUS [0:4]54 being PH2 84 active, each WSM 32 circuit evaluates SBUS [0:4]54 while PH1 82 is high.

The method of programming and erasing implemented by next state controller 72 can be understood with reference to the state diagram of FIG. 5.

In FIGS. 5a and 5b each bubble represents a state of write state machine 32. The name of each state is indicated on the top line of each bubble. The unique SBUS [0:4]54 value for each state is indicated below the state name. The signals which are selected or enabled during each state are listed below the SBUS [0:4] values. The combination of signals that cause the next state controller 72 to branch to another state are generally indicated in text beside each branch, with inactive signals preceded by an exclamation point "!". It will be understood that next state controller 72 branches from one state to another state regardless of the inputs to next state controller 72 when no combination of signals is indicated next to a branch.

When power is first applied to flash memory 20, the next state controller 72 is held in the POWER_UP state 120 by RESET 52. No events occur in this state, and the next state controller 72 simply begins execution after an active PROGRAM 38 or ERASE 40 is received from the command state machine 28.

Assume that after power-up, next state controller 72 receives an active PROGRAM 38 signal and an active ERASE 40 signal, as indicated by branch 122. These input signals cause the next state controller 72 to branch to the HARDWARE_ERR state 124.

In the HARDWARE_ERR state 124, the status register's 34 two fail bits, PRG_ERR and ERASE_ERR are set to a logic high, indicating a hardware failure. From state 124, the write state machine 32 branches back to the POWER-UP state 120, regardless of the input signals to next state controller 72.

Assume that after entering state 120, the next state controller 72 receives an active PROGRAM signal 38 and an inactive ERASE signal 40. This combination of signals initiates a program operation, which will be performed on the byte indicated by address lines 24. The indicated byte will be programmed substantially to the value indicated on the data lines 26. In this situation, the next state controller 72 takes branch 126 to the PROG_SETUP state 132.

In the PROG_SETUP state 132, the next state machine 72 is configured for a program operation. In state 132 the period counter 76 is reset and the event counter's 74 program count is selected. The program path in memory array 22 is set-up. Afterwards, the next state controller 72 takes branch 134 to the PROGRAM state 136.

In state 136, the byte indicated by the signals AY [0:6]55 and AX [0:9] 57 is programmed to a voltage level of approximately 6.75 volts, a logic 0. During state 136, the period counter 76 is configured for a program operation by selecting its program period. The write state machine 32 remains in state 136 until the period counter 72 reaches its terminal count, indicating that the program voltage has been applied for a sufficient period of time to bring the byte voltages to 6.75 volts.

The next state controller 72 takes branch 138 to the program equalization state PROG_EQ 140 when PCTRTC 88 becomes active, a logic high.

Events during state 140 prepare the write state machine 32 and the array 22 to perform program verification, i.e. to determine whether the previous program pulse successfully programmed the byte. In state 140 the period counter 76 is reset and the event counter 74 is enabled, allowing it to increment its count. The array 22 is enabled, allowing a byte to be read, and the program verify circuitry within the array 22 is turned on.

Now partially configured to perform program verification, next state controller 72 branches from state 140 to the PROG-VER-DELAY state 142. In state 142, the write state machine 32 verifies that the addressed byte has been successfully programmed by comparing the signal SOUT [0:7] to the program data stored in the DLC 80. The period counter 76 provides a verification delay to ensure that SOUT [0:7]59 is valid before verification is performed.

The array 22 is configured for program verification by enabling the word lines and turning on the read path of memory array 22. The DLC 80 is configured to perform program verification by bringing the signal CMPEN 287 active and bringing the signal PGVER 285 active. When active, the PGVER signal 285 allows the DLC 80 to indicate a match even when the microprocessor 999 has attempted to erase a programmed bit during a program operation. The effect of CMPEN 287 and PRGVER 285 will be discussed in more detail below with respect to the DLC 80 block diagram of FIG. 13.

During state 142, the program count of the event counter 74 remains selected, maintaining the event counter in the program event mode.

When PCTRTC 88 becomes active, the next state controller 72 examines MATCH 94 to determine whether the addressed byte has been successfully programmed. MATCH 94 will be a logic 1 if the byte has been successfully programmed and a logic 0 if it has not.

Given that the microprocessor 999 requested a program operation, the next state controller 72 can take only two of the three branches out of state 142.

Next state controller 72 takes branch 144 back to the PROGRAM-SETUP state 132 if the previous program pulse was not successful and the event counter 74 has not reached its terminal count, which in program mode indicates that the maximum number of program pulses per program operation have been applied to the byte. The write state machine 32 cycles through states 132, 136, 140, and 142 until the byte is successfully programmed or the event counter 74 times out, whichever occurs first.

When the event counter 74 reaches its terminal count or the byte has been successfully programmed, next state controller 72 takes branch 146 to the first program done state PROG-DONE1 148. No events occur in state 148.

The next state controller 72 branches to the PROG_DONE2 state 150 from state 148. Again, no events occur.

During a program event next state controller 72 can only take three branches 152, 154, or 159 out of state 150.

Next state controller 72 takes branch 159 to state 124 when the next state controller 72 receives any illegal value of SBUT [0:4]54. In the HARDWARE_ERR state 159 both the PRG_ERR and ERASE_ERR bits of the status register are set. The next state logic 72 thereafter branches to state 120 from state 159 and the program event ends in a hardware failure.

Table II illustrated in FIG. 6 includes SBUS [0:4]54 values for states that are mapped as hardware errors. Table III illustrated in FIG. 7 gives the names for the signal acronyms used in FIG. 6.

If the program operation has failed the next state controller 72 takes branch 152 to the PRG_FAIL state 160 from state 150. In the PROG-FAIL state 160 the status register's 34 program fail bit PRG_ERR is set. Afterward, next state controller 72 branches back to the POWER-UP state 120. Again the program operation ends as a failure.

If, on the other hand, the program operation has been successful, then next state controller 72 takes branch 154 directly to state 120 from state 150. In this instance the program operation is successfully completed.

Erasure of memory array 22 is initiated by receipt of an active ERASE signal 38 and an inactive PROGRAM signal 40 while in the POWER_UP state 120. This combination of signals initiates an erase operation and causes next state controller 72 to take branch 162 to the ERASE state 164.

In ERASE state 164 next state controller 72 initializes the write state machine 32 to precondition the memory array 22 by resetting the address, period, and event counters 78, 76, and 74.

From, ERASE state 160 next state controller 72 branches to state 132 and begins preconditioning the memory array 22; i.e. programming each bit, to a logic 0 prior to erasing the memory array 22.

During an erase operation next state controller 72 will cycle through states 132, 136 and 140 as described herein above with respect to program operations.

Differences between erase and program operations appear in the possible branches out of the PROG_VER_DELAY state 142. These differences occur, in part, because programming operations involve a single byte while erase operations involve the entire memory array 22. The additional possible states in an erase operation cycle the address counter 78 through each byte in the memory array 22.

Next state controller 72 branches to the PROG_INC_ADD state 166 from state 142 if the addressed byte has been successfully preconditioned. In the PROG_INC_ADD state 166 events prepare the write state machine 32 to precondition another byte of memory array 22. Address counter 78 is enabled, allowing its count to be incremented, thereby pointing to a new address within the memory array 22. The event counter 74 is reset and its program count selected. The program verify signal enables program verification of memory array 22.

Next state controller 72 branches from state 166 back to the PROG_SETUP state 132, unless the address counter 78 has reached it terminal count.

The write state machine 32 cycles through states 132, 136, 140, 142 and 166 until every byte of the memory array 22 is preconditioned or a byte cannot be successfully preconditioned.

If a byte cannot be successfully preconditioned the next state controller 72 branches to PROG DONE1 state 148 from PROG_VER_DELAY state 142. No events occur in state 148 and next state controller 72 branches to PROG_DONE2 state 150.

During an erase operation, next state controller 72 can take only three branches 156, 158 or 159 out of state 150.

The next state controller 72 takes branch 156 to the ERASE_FAIL state 168 when a byte has not been successfully preconditioned by the time the event counter 74 has reached its terminal count. In state 168 the ERASE_ERR bit is set. From state 168 next state controller 72 returns to the POWER-UP state 120. Thus, the erase operation ends unsuccessfully.

If, on the other hand, all bytes have been successfully preconditioned the next state controller 72 takes branch 158 to the ERASE-SETUP1 state 170 from state 150. The next state controller 72 then begins the process of erasing the memory array 22; i.e., bringing the cell voltages to approximately 3.25 volts.

In state 170 the address counter 78 and event counter 74 are reset. These actions prepare the write state circuitry 32 and the array 22 for erasure.

From state 170 next state controller 72 branches to ERASE_SETUP2 state 172. Events during state 172 further prepare the WSM 32 for erasing the array 22. In state 172 the value of SBUS [0:4]54 causes the period counter 76 to be reset and enables erase verification of memory array 22.

The next state controller 72 branches to the APPLY_ERASE state 176 from state 172. During state 176 the erase pulse is applied to the memory array 22 until the period counter 76 reaches its terminal count, Next state controller 72 advances from state 176 to the ERASE_OFF state 178 when PCTRTC 88 becomes active.

In anticipation of erase verification the period counter 76 is reset in state 178. The event counter 74 is enabled, allowing it to increment its count and the memory array 22 read lines continue to be enabled, allowing access to read the contents of memory array 22. Erase verification of the memory array 22 remains enabled.

Next state controller 72 branches to state 180 from state 178.

During the ERASE_VERIFY state 180 the write state machine 32 determines whether the indicated byte of memory has been successfully erased. The events in state 180 configure the WSM 32 to perform erase verification. During state 180 the period counter 76 is reset and its erase verification delay selected. The erase verification delay is approximately the time between when the erase voltage is removed and the SOUT [0:7] signals 59 are valid.

In state 180, the DLC 80 circuitry is configured to verify that the addressed byte has been successfully erased by setting the signal COMPDAT 283 to a logic one and bringing the signal CMPEN 287 active. The signals COMPDAT 283 and CMPEN 287 and the DLC 80 circuitry will be discussed in more detail herein below.

During state 180, the mad path of the memory array 22 is turned on and the memory array 22 is enabled, allowing memory array 22 to provide outputs SOUT [0:7]59 to the DLC 80.

After the period counter 76 times out, the next state controller 72 determines whether the erase operation has been successful by examining the MATCH signal 94. MATCH 94 is a logic one when the byte has been successfully erased and is a logic zero when the byte has not been successfully erased.

Next state controller 72 branches to state 172 from state 180 to apply another erase pulse if MATCH 94 indicates that the byte currently addressed has not been successfully erased and the event counter 74 and address counter 78 have not reached their terminal counts. The write state machine 32 cycles through states 172, 176 and 180 until the event counter 74 times out or the erasure of the addressed byte is successfully verified.

Next state controller 72 takes branch 182 to the ERASE_FAIL state 168 if a memory byte is not successfully erased after the event counter 74 reaches its terminal count. In state 168 the ERASE_ERR bit is set. Thereafter, the write state machine 32 branches back to state 120. The erase operation ends unsuccessfully.

The next state controller 72 branches to the ERASE_INC_ADD state 184 from state 180 when a byte is successfully verified and not every byte in the memory array 22 has been erased, as indicated by an inactive ACTRTC signal 92. In state 184 the address counter 78 is enabled, allowing it to increment its count and allowing signals AY [0:6]55 and AX [0:9]57 to point to another byte in array 22. In state 184, the memory array 22 and the DLC 80 are readied to verify the erasure of another byte within the memory array 22 by bringing CMPEN 287 active and enabling erase verification of the memory array 22.

After pointing to a new byte within the memory array 22, the write state machine 32 compares the value of that byte to the desired value to determine application of an additional erase pulse to the memory array is necessary. These events occur in states 180, 184 and 186.

The next state controller 72 branches to the ERASE_INC_DELAY state 186 from state 184. State 186 allows a small delay to expire before an erase verify operation is performed. In state 186 the DLC 80 is maintained in its erase-verify configuration by keeping COMPDAT 283 set to logic 1 and COMPEN 287 active. Erase verification of the memory array 22 continues to be enabled.

From state 186 the next state controller 72 branches back to the ERASE_VERIFY state 180. The DLC 80 compares the contents of the current memory location to voltage levels representative of an erased byte. If erase verification indicates that the byte is already erased, next state controller 72 will cycle through states 184, 186 and 180 until an unerased byte is located in the memory array 22 or until the address counter 78 reaches its terminal count, indicating that the all memory locations within memory array 22 have been erase verified.

The next state controller 72 branches back to state 172 from ERASE_VERIFY state 180 when an unerased memory location is reached and the address counter 78 has not yet reached its terminal count. Write state machine 32 will cycle through states 172, 176, 178, 180, 184, and 186 as described above until the last memory location address within the memory array 22 is reached or a byte cannot be successfully erased.

When every byte within the memory array 22 has been successfully erased, as indicated by ACTRTC 92 active, next state controller 72 takes branch 188 to the POWER_UP state 120. The erasure of the memory array 22 is thus successfully completed.

FIG. 8 illustrates in block diagram form the oscillator and phase generator 70. Oscillator 200 begins operating upon receipt of an inactive RESET signal 52. The oscillator 200 runs as long as RESET 52 is inactive. When RESET 52 is asserted the oscillator 200 ceases to run.

The output 202 of oscillator 200 is provided to the phase generator 204. The phase generator 204 includes a two-bit shift register that is held inactive until activated. The shift register shifts through 4 combinations— namely, "00," "01 ," "11 ," and "10." Two decoders of phase generator 204 watch for the "01" and "10" states and generate two out clocks—namely, PH1 82 and PH2 84, respectively, which are routed to nearly all circuits within WSM 32.

in the preferred embodiment, PH1/PH2 82 and 84 have a typical cycle time of 500 ns. The duty cycle of both PH1 82 and PH2 84 is approximately 25%.

The start-up timing for PH1 82 and PH2 84 in relation to RESET 52 and SBUS [0:4]54 can be seen in FIG. 9. RESET 52 goes low on the rising edge of either PROGRAM 38 or ERASE 40. After RESET 52 falls PH2 84 is the first clock to go active high.

SBUS [0:4]54 changes state on the rising edge of the second PH2 84 pulse; all circuits within WSM 32 evaluate SBUS [0:4]54 while PH1 82 is active to guarantee valid readings.

FIG. 10 illustrates in block diagram form the period counter 76. The period counter 76 includes a period counter SBUS decoder 210, a 15 bit shift register counter 212, a terminal count match circuit 214, and a latch 216.

The period counter SBUS decoder 210 controls the counter 212 and the terminal count match circuit 214. Decoder 210 decodes SBUS [0:4]54 and determines whether the counters 212 count should be reset and selects among the three possible terminal counts.

The operation of SBUS decoder 210 during each state illustrated in FIG. 5 can be determined with reference to FIG. 6. For example, FIG. 6 indicates that during the APPLY ERASE state 176, that the SBUS decoder 210 selects the erase terminal count by setting PCTSELERS to a logic 1.

SBUS decoder 210 is implemented using random logic in the preferred embodiment.

The shift register counter 212 does not incorporate a counter enable and thus continues to run in all states except for those in which it is reset by an active PCTRST signal 218.

The Q outputs 220 of the shift register 212 are fed to the terminal count match circuit 214. Terminal count match circuit 214 analyzes Q outputs 220 and indicates when a selected terminal count is reached. The terminal count match circuit recognizes three possible terminal counts: erase, program, and verify, which are selected by active signals PCTSELERS, PCTSELPGM, and PCTSELVER, respectively.

Approximate time periods are 10 μsec for each programming pulse, 10 msec for each erase pulse, and 3 μsec for each program verify operation and each erase verify operation.

Output TCOUNT 222 is active for only one state because the counter 212 continues to increment TCOUNT 222. To store the active terminal count signal, TCOUNT 222, latch 216 is used in conjunction with OR gate 217.

Latch 216 is reset by RESET 52 when the write state machine 32 is first powered up, setting its Q output 224 to a logic 0. Latch 216 is also reset when the PCTRST 218 signal is asserted. When TCOUNT 222 goes active high, Q output 224 goes to a logic 1. Q output 224 keeps the latch's input at logic 1 after TCOUNT 222 goes inactive, thus keeping PCTRTC 88 at a logic 1 until latch 216 is reset by RESET 52.

FIG. 11 illustrates in block diagram form the event counter 74. The event counter 74 includes an event counter SBUS decoder 230, a thirteen bit counter 232, an event counter terminal count match circuit 234, a latch 236, and an OR gate 238.

The event counter SBUS decoder 230 controls the counter 232 and the terminal count match circuit 234. Decoder 230 decodes SBUS [0:4]54 and determines whether the counter 232 should be enabled or reset, and selects between the two possible event counter terminal counts.

The operation SBUS decoder 230 for each state of FIG. 5 can be determined with reference to FIG. 6. For example, FIG. 6 indicates that during the ERASE_VERIFY state 180 SBUS decoder 230 selects the erase terminal count by setting ECTRER, The event counter SBUS decoder 230 is implemented using random logic in the preferred embodiment.

The counter 232 is reset by the SBUS decoder 230 whenever the WSM 32 begins to program, precondition or erase a new byte. The counter 232 increments its count only when enabled by active ECTREN signal 240. The Q outputs 242 of counter 232 are fed to the event counter terminal count match circuit 234.

Event counter terminal count match circuit 234 analyzes Q outputs 242 and indicates when a selected terminal count is reached. The event counter terminal count match circuit 234 recognizes two possible terminal counts; namely, erase and program, which are selected by the signals ECTRER and ECTRPG.

Event counter 74 allows over 8000 erase pulses to be applied during an erase operation and 50 program pulses to be applied during a program operation.

TCOUNT 244 is latched in exactly the same fashion as TCOUNT 222 using latch 236 and OR gate 238.

FIG. 12 illustrates in block diagram form the address counter 78. The address counter 78 includes TTL input buffers 250, 252 address counter SBUS decoders 254, 256, a 17 bit linear counter 258 and a bypass multiplexer 260.

The buffers 250 and 252 convert TTL inputs A [0:16]24 to the CMOS levels of AIN [0:16]262. Outputs AIN [0:16] 262 are applied to the bypass multiplexer 260 and to the parallel load inputs of counter 258.

When the READY 50 is a logic high, the address counter 78 provides flow through addressing by selecting AIN [0:16]262 as the output of bypass multiplexer 260.

The SBUS decoders 254 and 256 control the operation of the counter 258. SBUS decoder 254 provides counter 258 with a reset signal, ACTRRST 266. SBUS decoder 256 decodes SBUS [0:4]54 to generate a counter enable signal, ACTEN 268.

The operation of SBUS decoders 254 and 256 can be understood with reference to FIG. 6. For example, FIG. 6 indicates that SBUS decoder 256 enables counter 258 during the PROG_INC_ADD state 166 by bringing the signal ACTEN 268 to a logic 1.

The SBUS decoders 254 and 256 are implemented using random logic in the preferred embodiment.

The counter 258 is a 17 bit linear counter with parallel load and will not be described in detail herein.

During a program operation the address counter 78 operates as follows. Before the command state machine 28 issues a program command to the write state machine 32, READY 50 is a logic high indicating that write state machine 32 is ready to perform an operation. This selects AIN [0:16] 262 as the output of bypass multiplexer 260.

Prior to bringing signal PROGRAM 38 to an active condition, the command state machine 28 brings the address latch enable signal, ALE 49, active. Active ALE 49 loads the buffered address outputs AIN [0:16]262 into the counter 258. Signals AQ [0:16]264 and AIN [0:16]262 will be the same value until the counter 258 is enabled and increments its count.

The bypass multiplexer 260 selects AQ [0:16]264 as output when PROGRAM 38 becomes active. The multiplexer 260 selects AQ [0:16]264 by forcing READY 50 inactive. The counter 258 is not allowed to increment its count during a program operation, thus counter 258 acts as an address latch during program operations.

The operation Of the address counter 28 during erase operations is initially similar to that during program operations. However, the counter 258 is enabled during erase operations in the PROG_INC_ADD state 166 and ERASE_INC_ADD state 184, allowing signals AY [0:6]55 and AX [0:9]57 to cycle through the addresses within memory array 22 until the end of address space of the memory array 22 is reached, as indicated by active state of ACTRTC 92.

FIG. 13 illustrates in block diagram form of the data latch and comparator circuit ("DLC") 80. The DLC 80 includes eight latch and comparator circuits 270a–270h, one for each data bit, DLC SBUS decoders 282, 284, and 286, an AND gate 288, a multiplexer 290, and a latch 292.

Microprocessor 999 writes commands to flash memory 20 via data lines DATA [0:7]26, while holding CEB 44a and WEB 46 active. The active CEB 44a and WEB 46 enable the TTL input buffers 272a–272h within each DLC latch and comparator circuit 270a–270h to convert the data on lines 26 to CMOS the level signals of DATAIN [0:7]27.

The CSM 28 brings data latch enable signal DLE 47 active if DATAIN [0:7]27 represents a program or an erase command. When DLE 47 becomes active, the data from TTL buffers 272a–272h is clocked into latches 274a–274h, During program verification the latch and comparator circuits 270a–270h operate as follows. ERASE 40 is inactive, selecting the 10 inputs 273 of multiplexers 276a–276h as the multiplexers' outputs. Thus, the data stored in latches 272a–272h is applied to the LAT inputs 277 of comparators 278a–278h.

The comparator outputs 279a–279h indicate whether each bit of the program data matches the sense amp outputs SOUT [0:7]59. For each comparator 278a–278h, if the two comparator inputs SOUT 275 and LAT 277 agree, the comparator output will be a logic one. If the comparator inputs 275 and 277 do not agree, the output 279 will be a logic 0.

During program verification, the operation of the comparators 278a– —278h described above is modified by the active program verify signal PGVER 285. As can be seen from Table 1, when PGVER 285 is active, comparators 278a–278h output a logic 1 when the memory cell stores a logic 0 and the memory cell should store a logic 1. The comparators 278a– 278h indicate a match in this situation because the write state machine 32 cannot erase a programmed bit during a program operation.

TABLE 1

|  |  | MATCH OUTPUT | |
| --- | --- | --- | --- |
| SOUT | LAT | PGVER INACTIVE | PGVER ACTIVE |
| 0 | 0 | 1 | 1 |
| 0 | 1 | 0 | 1 |
| 1 | 0 | 0 | 0 |

TABLE 1-continued

| | | MATCH OUTPUT | |
|---|---|---|---|
| SOUT | LAT | PGVER INACTIVE | PGVER ACTIVE |
| 1 | 1 | 1 | 1 |

The MATCH outputs 279a–279h of all the comparators 278a–278h are ANDed together by AND gate 288. The output of AND gate 288 is a logic 1 when each bit of SOUT [0:7]59 and DATAIN [0:7]27 match and a logic 0 when SOUT [0:7]59 and DATAIN [0:7]27 do not match.

The output 289 of AND gate 288 is applied to the I1 input of the output multiplexer 290. The I1 input of multiplexer 290 is selected as the output of multiplexer 290 by an active CMPEN signal 287.

CMPEN 287 is active during program verification, thus allowing the AND gate output 289 to flow through latch 292 and control the logic state of MATCH signal 94.

The value of MATCH 94 is stored by latch 292 when the next state controller 72 moves out of the program verification state. The Q output of latch 292 is fed back to the 10 input of multiplexer 290. When CMPEN 287 becomes inactive, the 10 input of multiplexer 290 is selected allowing it to control the latch 292.

MATCH 94 is reset by RESET 52.

The operation of the data latch and comparator circuits 270a–270h during erase verification is similar to that described above for program verification, with the following exceptions. First, I1 inputs of multiplexers 276a–276h are set to a logic 1 by the active COMPDAT1 283 signal during erase verification. This establishes a voltage reference with which to compare the sense amp outputs. Second, active ERASE 40 selects the I1 inputs of multiplexers 276a–276h to be output to the comparators 278a–278h. Third, PGVER 285 is inactive, which permits comparators 278a–288h to operate without modification.

The DLC SBUS decoders 282, 284 and 286 help control the operation of data latch and comparator circuits 272a–272h. The operation of DLC SBUS decoders 282, 284 and 286 can be determined with reference to FIG. 6. For example, FIG. 6 indicates that in the ERASE_INC_ADD, ERASE_INC_DELAY and ERASE_VERIFY states 184, 186, 180 DLC SBUS decoder 286 sets CMPEN 287 high.

In a preferred embodiment, DLC SBUS decoders 282, 284, and 286 are implemented using random logic.

FIG. 14 illustrates in block diagram form the status register 34. The status register 34 includes a clock generator 300, five output latches 302a–302e, one for each bit of signal STATUS [3:7]56, status register SBUS decoders 304 and 306, latches 308 and 312, OR gates 310 and 314, and inverter 316.

The status register's outputs 56 are synchronized to output enable bar signal. OEB 46a. The clock generator 300 accomplishes this synchronization by generating a set of clock pulses PH'1/PH'2 320 whenever OEB 46a toggles states. Clock pulses PH'1/PH'2 320 control the clocking in of data into output latches 302a–302e. Thus, it will be understood that OEB 42 must be toggled in order to mad valid data from the output latches 302a–302e.

The signals READY 50, IDLE 53, and LOWVPP 51 are input directly to the D inputs of output latches 302a–302c respectively.

Status register SBUS decoder 304 decodes SBUS [0:4]54 to detect program failures. When SBUS decoder 304 detects a failure, PRGFAIL 322 is set to a logic 1. Because SBUS [0:4]54 indicates a program failure during only one state period, the active PRGFAIL signal 322 is stored using latch, 308 and OR gate 310, until the microprocessor 999 chooses to reset the status register 34. The status register 34 is reset by bringing STATRS 45 active. This pair of devices, latch 308 and OR gate 310, operates in the same as a substantially similar pair of devices in the period counter 76.

Status register SBUS decoder 306 decodes SBUS [0:4]54 to detect erase failures. When SBUS decoder 306 detects a failure ERSFAIL signal 324 is set high. Because SBUS [0:4]54 indicates an erase failure for only one state period, the active ERSFAIL signal 324 is stored using latch 312 and OR gate 314 until the microprocessor 999 chooses to reset the status register. This pair of devices, OR gate 314 and latch 312, operates in the same manner as a substantially similar pair of devices in the period counter 76.

Table II of FIG. 6 describes the Operation of status register SBUS decoders 304 and 306. For example, FIG. 6 indicates that for all hardware failure states, PRGFAIL 322 is set.

In a preferred embodiment, both status register SBUS decoders 304 and 306 are implemented in random logic.

The active outputs of latches 308 and 312 are reset when status register reset signal STATRS 45 is active high, which occurs as the result of receipt of the CLEAR STATUS REGISTER command from the microprocessor 999.

STATUS [3:7] outputs 56 include RDY/BSY signal, also known as STAT7. When RDY/BSY is a logic zero when the write state machine 32 is busy. A logic one on STAT 7 indicates that the write state machine 32 has completed its operation and is prepared to perform another operation and that the other status outputs are valid, The STAT 6 signal is also known as the ERASE_SUSPEND signal. ERASE_SUSPEND becomes active, a logic 1, when the WSM 32 has entered an idle state during an erase operation, and indicates that the memory array 22 is readable. ERASE_SUSPEND is set and cleared by the synchronizer 30, based upon a request from the microprocessor 999 and the status of the WSM 32.

The STAT 5 signal is also known as the erase fail signal, ERASE_FAIL The ERASE_FAIL signal is set to a logic 1 if the WSM 32 cannot successfully preprogram or erase the memory array 22. ERASE_FAIL is also set to a logic 1 if the erase command is botched or a hardware error is encountered. The ERASE_FAIL signal is set by the WSM 32 and cleared by the STATUS REGISTER CLEAR command.

The STAT 4 signal is also known as the program fail signal, PRG_FAIL. PRG_FAIL is set to a logic one if the WSM 32 cannot successfully program a byte. PRG_FAIL is also set to a logic 1 if an erase command is botched or a hardware error is encountered, PRG_FAIL is set by SBUS [0:4]54 and cleared by the STATUS REGISTER CLEAR command.

The STAT 3 signal is also known as LOW_VPP. LOW_VPP is set if the programming voltage Vpp 38 drops anytime during a program or erase operation. However, if PRG_FAIL or ERASE_FAIL is also set then the low voltage level of Vpp 36 had no effect on the operation. LOW_VPP is cleared by STATRS.

The status register 34 also outputs to the synchronizer 30 the status register reset bar signal STATRB 61, which is an inversion of STATRS 45.

In summary, circuitry for programming and erasing a non-volatile flash memory has been described. Once a program or an erase operation is initiated, the write state machine 32 generates all control signals necessary to complete the requested operation, thus freeing the microprocessor 999 to perform other functions.

In the foregoing specification, the invention has been described with specific exemplary embodiments thereof. It will, however, be evident that various modifications and changes may be made thereto without departing from the broader spirit and scope of the invention as set forth in the appended claims. The specifications and drawings are, accordingly to be regarded in an illustrative rather than a restrictive sense.

What is claimed is:

1. A control circuit for controlling a programming of a nonvolatile memory array, comprising:

(A) a period counter that times a duration of a programming pulse applied to a memory cell of the nonvolatile memory array and asserts a first terminal count signal when the duration of the programming pulse is equal to a predetermined duration;

(B) a comparator that compares a logic level of the memory cell with a predetermined reference value and asserts a match signal when the logic level is equal to the predetermined reference value;

(C) an event counter that counts a number of times the programming pulse is applied to the memory cell and asserts a second terminal count signal when the number is equal to a predetermined number;

(D) a state controller coupled to the period counter, the comparator, and the event counter to receive the first and second terminal count signals and the match signal, wherein the state controller generates control signals to automatically cause the programming pulse to be applied to the memory cell upon receipt of an initiation signal, wherein the state controller causes the programming pulse to be reapplied to the memory cell when the first terminal count signal is asserted and the match signal and second terminal count signal are not asserted until the match signal or the second terminal count signal is asserted.

2. The control circuit of claim 1, wherein the state controller further comprises a programmable logic array (PLA).

3. The control circuit of claim 1, further comprising a status register that is loaded with data by the state controller, wherein the data indicates whether the memory cell was successfully programmed.

4. A control circuit for controlling an erasure of a nonvolatile memory array, comprising:

(A) a period counter that times a duration of an erase pulse applied to a memory cell of the nonvolatile memory array and asserts a first terminal count signal when the duration of the erase pulse is equal to a predetermined duration;

(B) a comparator that compares a logic level of the memory cell with a predetermined reference value and asserts a match signal when the logic level is equal to the predetermined reference value;

(C) an event counter that counts a number of times the erase pulse is applied to the memory cell and asserts a second terminal count signal when the number is equal to a predetermined number; and (D) a state controller coupled to the period counter, the comparator, and the event counter to receive the first and second terminal count signals and the match signal, wherein the state controller generates control signals to automatically cause the erase pulse to be applied to the memory cell upon receipt of an initiation signal, wherein the state controller causes the erase pulse to be reapplied to the memory cell when the first terminal count signal is asserted and the match signal and second terminal count signal are not asserted until the match signal or the second terminal count signal is asserted.

5. The control circuit of claim 4, wherein the state controller further comprises a programmable logic array (PLA).

6. The control circuit of claim 4, further comprising a status register that is loaded with data by the state controller, wherein the data indicates whether the memory cell was successfully erased.

7. A control circuit for controlling a programming of a nonvolatile memory array, comprising:

(A) period counting means for timing a duration of a programming pulse applied to a memory cell of the nonvolatile memory array and asserting a first terminal count signal when the duration of the programming pulse is equal to a predetermined duration;

(B) comparison means for comparing a logic level of the memory cell with a predetermined reference value and asserting a match signal when the logic level is equal to the predetermined reference value;

(C) event counting means for counting a number of times the programming pulse is provided to the memory cell and asserting a second terminal count signal when the number is equal to a predetermined number; and (D) controller means coupled to the period counting means, the comparison means, and the event counting means for receiving the first and second terminal count signals and the match signal, and for generating control signals to automatically cause the programming pulse to be applied to the memory cell upon receipt of an initiation signal, wherein the controller means causes the programming pulse to be reapplied to the memory cell when the first terminal count signal is asserted and the match signal and second terminal count signal are not asserted until the match signal or the second terminal count signal is asserted.

8. The control circuit of claim 7, further comprising a status means for storing data that is provided by the controller means, wherein the data indicates whether the memory cell was successfully programmed.

9. A control circuit for controlling an erasure of a nonvolatile memory array, comprising:

(A) period counting means for timing a duration of an erase pulse applied to a memory cell of the nonvolatile memory array and asserting a first terminal count signal when the duration of the erase pulse is equal to a predetermined duration;

(B) comparison means for comparing a logic level of the memory cell with a predetermined reference value and asserting a match signal when the logic level is equal to the predetermined reference value;

(C) event counting means for counting a number of times the erase pulse is applied to the memory cell and asserting a second terminal count signal when the number is equal to a predetermined number; and (D) controller means coupled to the period counting means, the comparison means, and the event counting means for receiving the first and second terminal count signals and the match signals, and for generating control signals to automatically cause the erase pulse to be applied to the memory cell upon receipt of an initiation signal, wherein the controller means causes the erase pulse to be reapplied to the memory cell when the first terminal count signal is asserted and the match signal and second terminal count signal are not asserted until the match signal or the second terminal count signal is asserted.

10. The control circuit of claim further comprising a status means for storing data provided by the controller means, wherein the data indicates whether the memory cell was successfully erased.

* * * * *

UNITED STATES PATENT AND TRADEMARK OFFICE
CERTIFICATE OF CORRECTION

PATENT NO. : 5,513,333
DATED : April 30, 1996
INVENTOR(S) : Kynett et al.

It is certified that error appears in the above-identified patent and that said Letters Patent is hereby corrected as shown below:

In column 6 at line 11 delete "counters" and insert --counter's--

In column 10 at line 2 delete "PROG DONE1" and insert --PROG_DONE1--

In column 10 at line 58 delete "mad" and insert --read--

In column 12 at line 7 delete "in" and insert --In--

In column 12 at line 26 delete "counters" and insert --counter's--

In column 14 at line 10 delete "Of" and insert --of--

In column 15 at line 60 delete "mad" and insert --read--

UNITED STATES PATENT AND TRADEMARK OFFICE
CERTIFICATE OF CORRECTION

PATENT NO. : 5,513,333
DATED : April 30, 1996
INVENTOR(S) : Kynett et al.

It is certified that error appears in the above-indentified patent and that said Letters Patent is hereby corrected as shown below:

In column 16 at line 58 delete "38" and insert --36--

In column 20 at line 1 insert --9,-- following "claim" and before "further"

Signed and Sealed this

Thirtieth Day of July, 1996

Attest:

BRUCE LEHMAN

Attesting Officer

Commissioner of Patents and Trademarks